United States Patent
Wu et al.

(10) Patent No.: US 8,982,314 B2
(45) Date of Patent: Mar. 17, 2015

(54) PHOTOLITHOGRAPHIC APPARATUS

(75) Inventors: Qiang Wu, Beijing (CN); Yiming Gu, Beijing (CN)

(73) Assignee: Semiconductor Manufacturing International (Beijing) Corporation (CN)

(*) Notice: Subject to any disclaimer, the term of this patent is extended or adjusted under 35 U.S.C. 154(b) by 477 days.

(21) Appl. No.: 13/405,238

(22) Filed: Feb. 25, 2012

(65) Prior Publication Data

US 2013/0083302 A1 Apr. 4, 2013

(30) Foreign Application Priority Data

Sep. 29, 2011 (CN) .......................... 2011 1 0295458

(51) Int. Cl.
*G03B 27/32* (2006.01)
*G03F 7/20* (2006.01)

(52) U.S. Cl.
CPC ........ *G03F 7/70575* (2013.01); *G03F 7/70466* (2013.01); *G03F 7/203* (2013.01)
USPC .......................................................... 355/27

(58) Field of Classification Search
USPC .......................................... 355/52, 53, 55, 67
See application file for complete search history.

(56) References Cited

U.S. PATENT DOCUMENTS

| | | | |
|---|---|---|---|
| 5,959,779 A | 9/1999 | Yamazaki et al. | |
| 7,494,935 B2 * | 2/2009 | Jung et al. | ...................... 438/725 |
| 7,932,994 B2 * | 4/2011 | Nagasaka | ........................ 355/53 |
| 2002/0160318 A1 | 10/2002 | Richter et al. | |
| 2008/0013062 A1 * | 1/2008 | Nagasaka | ........................ 355/53 |
| 2009/0123874 A1 * | 5/2009 | Nagayama | ..................... 430/311 |

FOREIGN PATENT DOCUMENTS

| | | |
|---|---|---|
| CN | 101286012 A | 10/2008 |
| WO | 2010/045137 A1 | 4/2010 |

* cited by examiner

*Primary Examiner* — Hung Henry Nguyen
(74) *Attorney, Agent, or Firm* — Innovation Counsel LLP

(57) ABSTRACT

A photolithographic apparatus for use with a photo-resist comprises a first component that generates a first chemical substance and produces a chemical amplification action and a second component that generates a second chemical substance. The photolithographic apparatus comprises a first exposure subsystem for selectively illuminating a surface of the photo-resist using a light of a first wavelength band such that the first component generates the first chemical substance and a second exposure subsystem for uniformly illuminating the surface using a light of a second wavelength band such that the second component generates the second chemical substance. The second chemical substance reacts with the first chemical substance to reduce the mass concentration of the first chemical substance in the photo-resist and improves the contrast of a latent image of the first chemical substance formed in the photo-resist.

38 Claims, 6 Drawing Sheets

PHOTOLITHOGRAPHIC APPARATUS

CROSS-REFERENCES TO RELATED APPLICATIONS

This application claims priority to Chinese Patent Application No. 201110295458.0, filed on Sep. 29, 2011 and entitled "Photolithographic Apparatus", which is incorporated herein by reference in its entirety.

This patent application is related to the following co-pending, commonly assigned patent applications, the disclosure of which are incorporated herein by reference in their entirety:
1. "Photolithographic Method" by Qiang Wu and Yao Xu, U.S. patent application Ser. No. 13/405,233 filed on Feb. 25, 2012.
2. "Photo-resist and Method of Photolithography" by Qiang Wu and Yiming Gu, U.S. patent application Ser. No. 13/405,235 filed on Feb. 25, 2012.

BACKGROUND OF THE INVENTION

1. Field of the Invention

The present invention relates generally to a photolithographic apparatus, and more specifically, to a photolithographic apparatus for a photo-resist that contains a photoacid generator and a photobase generator.

2. Description of the Related Art

With the rapid development of the microelectronic industry, critical dimensions of a semiconductor device continue to shrink. The shrinkage of the critical dimensions of a device depends on exposure subsystems. On the other hand, the shrinkage is closely related to properties of a photo-resist. Thus, the choice of photo-resist properties associated with photolithography is important.

The advancement of photolithography promotes the steady improvement in performances of a photo-resist. A chemical amplification photo-resist has high sensitivity and strong capability to withstand dry corrosion to facilitate subsequent processes of semiconductor devices. The chemical amplification photo-resist thus has a broader application prospect in the semiconductor manufacturing field and gradually gains attention in the photolithographic process. It is believed that the chemically amplified photo-resist having steady processing properties will play an important role in the semiconductor industry.

The chemically amplified photo-resist generally contains three components: a matrix resin, an organic solvent, and a photoacid generator (PAG). After the chemically amplified photo-resist has been exposed or illuminated with light, the PAG absorbs energy and undergoes photolysis. Thus, free acid is generated, which results in an acid catalytic reaction such that the matrix resin in exposure region undergoes removal reaction of protecting groups or a cross-linking reaction between resin and cross linker, forming positive or negative latent images which are then subjected to development in a certain solvent to form exposure images. In addition, some chemically amplified photo-resists employ a photobase generator (PBG) instead of a photoacid generator. An alkaline catalytic reaction takes place with the help of photobase, which likewise results in that the matrix resin undergoes a removal reaction of protecting groups or a cross-linking reaction between resin and cross linker, forming positive or negative latent images.

However, the contrast of latent images will be degraded due to following factors: One factor is the diffusion of photoacid or photobase. The photoacid or photobase generated by illumination with a light of a first wavelength band gradually diffuses from a position of high mass concentration to a position of low mass concentration. In this way, the mass concentration distribution of photoacid or photobase departs from the optical image and degrades the contrast of latent images of photoacid or photobase. The second factor is photo diffraction. Theoretically, an optical image formed by means of a mask should be a simple binary image. That is, in the optical image, the light intensity of a part of the image where the light is sheltered by the mask is zero while the light intensity of the other part of the image where the light transmits through the mask is a constant. However, in practice, with the continuous shrinkage of the critical dimension for a semiconductor process, light diffraction effect becomes more severe, such that the part of the optical image that should have zero light intensity has a non-zero amount of light intensity. As a result, the contrast of the latent image of the photoacid is further degraded.

In the conventional photolithographic process, a method of restricting the diffusion length of photoacid or photobase is employed to enhance the contrast of latent images. However, the method is disadvantageous since it will make the removal reaction or the cross-linking reaction less efficient. Moreover, the conventional method does not prevent the degradation of contrast of latent images caused by diffraction.

BRIEF SUMMARY OF THE INVENTION

According to a first aspect of the present invention, there is provided a photolithographic apparatus for use with a photo-resist that contains a first component and a second component. The photolithographic apparatus includes a first exposure subsystem for selectively illuminating a selected region of a surface of the photo-resist that coats a substrate using a light of a first wavelength band, such that the first component generates a first chemical substance and produces a chemical amplification action, and a second exposure subsystem for uniformly illuminating all regions of the surface (i.e., the entire surface) of the photo-resist using a light of a second wavelength band, such that the second component generates a second chemical substance. The second wavelength band is different from the first wavelength band, the second chemical substance reacts with the first chemical substance to reduce a mass concentration of the first chemical substance in the photo-resist.

In an embodiment, the first exposure subsystem includes a first light source for emitting the light of the first wavelength band, and a first exposure optical device for imaging an optical pattern formed after the light of the first wavelength band passes through a mask onto the surface of the photo-resist, so as to define the selected region of the surface of the photo-resist.

In an embodiment, the second exposure subsystem includes a second light source for emitting a light of a second wavelength band, and a second exposure optical device for projecting the light oft second wavelength band onto all regions of the surface of the photo-resist.

In an embodiment, the second exposure optical device includes a beam homogenizer, wherein the light of the second wavelength band becomes a light of a uniform intensity distribution after passing through the beam homogenizer; and an optical device for varying a diameter of a beam.

In an embodiment, the second light source comprises a wavelength selector for selecting the light of the second wavelength band among lights emitted from the second light source.

In an embodiment, the second exposure subsystem further comprises an exposure controller for controlling an exposure dose of the second exposure subsystem by setting a light intensity and an exposure time of the second exposure subsystem.

In an embodiment, the second exposure subsystem further comprises a light intensity closed loop controller for controlling a light intensity of the light of the second wavelength band by determining whether or not a difference between the light intensity of the light of the second wavelength band and a predetermined light intensity exceeds a predetermined threshold.

In an embodiment, the second exposure subsystem is coupled to the first exposure subsystem, and an operation of the second exposure subsystem is triggered by an operation of the first exposure subsystem.

In an embodiment, the uniform illumination by the second exposure subsystem using the light of the second wavelength band is performed concurrently with the selective illumination by the first exposure subsystem.

In an embodiment, the uniform illumination by the second exposure subsystem using the light of the second wavelength band is performed immediately after the selective illumination by the first exposure subsystem.

In an embodiment, the photolithographic apparatus further comprises an alignment and leveling device for aligning and leveling the substrate with the mask.

In an embodiment, the second exposure subsystem is coupled to the alignment and leveling device, and an operation of the second exposure subsystem is triggered by an operation of the alignment and leveling device.

In an embodiment, the uniform illumination by the second exposure subsystem using the light of the second wavelength band is performed before the selective illumination by the first exposure subsystem.

In an embodiment, the uniform illumination by the second exposure subsystem using the light of the second wavelength band is performed concurrently with the alignment and leveling by the alignment and leveling device.

In an embodiment, the uniform illumination by the second exposure subsystem using the light of the second wavelength band is performed immediately after the alignment and leveling by the alignment and leveling device.

In an embodiment, the photo-resist further comprises a matrix resin, and the first chemical substance is capable of reacting with the matrix resin to form a latent image.

In an embodiment, the first component is a photoacid generator and the first chemical substance is a photoacid; and, the second component is a photobase generator and the second chemical substance is a photobase.

In another embodiment, the first component is a photobase generator and the first chemical substance is a photobase; and, the second component is a photoacid generator and the second chemical substance is a photoacid.

In an embodiment, the photolithographic apparatus further comprises a developing device for performing a development process for the photo-resist so as to form a desired photo-resist pattern.

According to a second aspect of the present invention, there is provided photolithographic apparatus for use with a photo-resist that contains a first component and a second component that are capable of producing chemical amplification action, wherein a light of a first wavelength band is used for selectively illuminating a selected region of a surface of the photo-resist that coats a substrate such that the first component generates a first chemical substance. The photolithographic apparatus includes a light source for emitting a light of a second wavelength band; and an exposure optical device for uniformly illuminating all regions of the surface of the photo-resist using the light of a second wavelength band, such that the second component generates a second chemical substance. The second wavelength band is different from said first wavelength band, the second chemical substance is capable of reacting with the first chemical substance to reduce a mass concentration of the first chemical substance in the photo-resist.

In an embodiment, the exposure optical device includes a beam homogenizer, wherein the light of the second wavelength band becomes a light of a uniform intensity distribution after passing through the beam homogenizer; and an optical device for varying a diameter of a beam.

In an embodiment, the light source comprises a wavelength selector for selecting the light of a second wavelength band among lights emitted from the light source.

In an embodiment, the photolithographic apparatus further comprises an exposure controller for controlling an exposure dose of the photolithographic apparatus by setting a light intensity and an exposure time of the photolithographic apparatus.

In an embodiment, the photolithographic apparatus further comprises a light intensity closed loop controller coupled to the exposure controller, for controlling a light intensity of the light of the second wavelength band by determining whether or not a difference between the light intensity of the light of a second wavelength band and a predetermined light intensity exceeds a predetermined threshold.

In an embodiment, the uniform illumination with the light of the second wavelength band is performed concurrently with the selective illumination with the light of the first wavelength band.

In an embodiment, the uniform illumination with the light of a second wavelength band is performed immediately after the selective illumination with the light of a first wavelength band.

In an embodiment, the uniform illumination with the light of the second wavelength band is performed immediately before the selective illumination with the light of the first wavelength band.

In an embodiment, the photolithographic apparatus further comprises an alignment and leveling device, wherein the uniform illumination with the light of the second wavelength band is performed concurrently with the alignment and leveling by the alignment and leveling device.

In an embodiment, the photolithographic apparatus further comprises an alignment and leveling device, wherein the uniform illumination with the light of the second wavelength band is performed immediately after the alignment and leveling by the alignment and leveling device.

In an embodiment, the photo-resist further comprises a matrix resin, and the first chemical substance is capable of reacting with the matrix resin to form a latent image.

In an embodiment, the first component is a photoacid generator and the first chemical substance is a photoacid; and, the second component is a photobase generator and the second chemical substance is a photobase.

In another embodiment, the first component is a photobase generator and the first chemical substance is a photobase; and, the second component is a photoacid generator and the second chemical substance is a photoacid.

In an embodiment, the photolithographic apparatus further comprises a developing device for performing development process for said photo-resist so as to form a desired photo-resist pattern.

Embodiments of the present invention improve the contrast of the latent image of the first chemical substance formed in the photo-resist and reduce edge roughness of photolithographic patterns obtained after a development process.

Further features of the present invention and advantages thereof will become apparent from the following detailed description of exemplary embodiments according to the present invention with reference to the accompanying drawings.

BRIEF DESCRIPTION OF THE DRAWINGS

The accompanying drawings, which are incorporated in and constitute a part of the specification, illustrate embodiments of the invention and, together with the description, serve to explain the principles of the invention, in which.

DETAILED DESCRIPTION OF THE INVENTION

Figure 1:
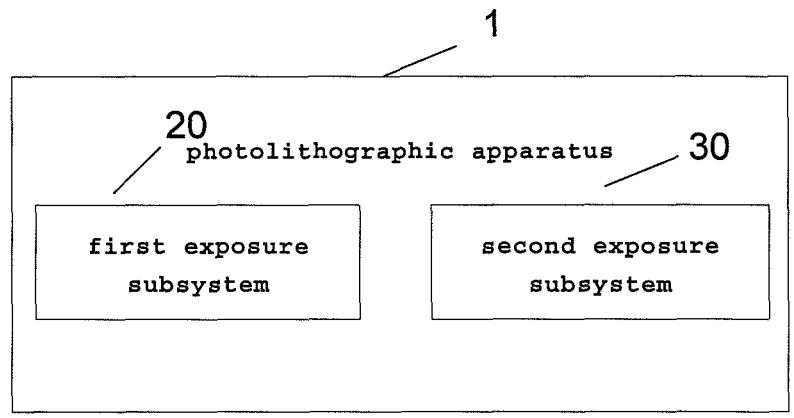
FIG. 1 is a simplified block diagram illustrating a photolithographic apparatus 1 according to an embodiment of the present invention.

Various exemplary embodiments of the present invention will now be described in detail with reference to the drawings.

It should be noted that the relative arrangement of the components and steps, the numerical expressions, and numerical values set forth in these embodiments do not limit the scope of the present invention unless it is specifically stated otherwise.

It should be understood that, for the convenience of description, components in the figures are not necessarily drawn to scale.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In the examples illustrated and discussed herein, any specific values should be interpreted to be illustrative and non-limiting. Thus, other examples of the exemplary embodiments could have different values.

Notice that similar reference numerals and letters refer to similar items in the following figures, and thus, once an item is defined in one figure, it may not be further discussed for following figures.

Below, in conjunction with FIGS. 1 to 14, the configuration and operation of the photolithographic apparatus according to the present invention will be described.

FIG. 1 is a block diagram illustrating a photolithographic apparatus 1 for a photo-resist that contains a first component and a second component according to an embodiment of the present invention.

In an example embodiment, the first component in the photo-resist is adapted to generate a first chemical substance under illumination of a light of a first wavelength band, and the first chemical substance is adapted to react with a matrix resin to form a latent image. The second component in the photo-resist is adapted to generate a second chemical substance under illumination of a light of a second wavelength band, and the second chemical substance is adapted to react with the first chemical substance to reduce a mass concentration of the first chemical substance in the photo-resist.

As shown in FIG. 1, the photolithographic apparatus 1 comprises a first exposure subsystem 20 that is adapted to selectively illuminate a selected region of a surface of the photo-resist that coats a substrate using the light of the first wavelength band, and a second exposure subsystem 30 for uniformly illuminating all regions of the surface (i.e., the entire surface) of the photo-resist using the light of the second wavelength band. Moreover, the second wavelength band is different from the first wavelength band.

In an exemplary embodiment of the present invention, the photo-resist comprises a photoacid generator (PAG), a photobase generator (PBG), a matrix resin and the like. In this photo-resist, the photoacid generator is sensitive to the light of the first wavelength band, which absorbs energy to generate a photoacid by photolysis, when the light of the first wavelength band illuminates the photo-resist. The resin in the photo-resist will interact with the photoacid to remove the resin in an exposed region of the photo-resist.

The photobase generator in the photo-resist mentioned above is sensitive to the light of the second wavelength band. When illuminated by the light of the second wavelength band, the photobase generator absorbs light energy and generates a photobase by photolysis. The photobase can react with the photoacid to reduce the mass concentration of the photoacid in the photo-resist, thereby improving the contrast of a latent image of the photoacid formed in the photo-resist.

The photolithographic apparatus 1 further comprises a developing device 40 (not shown in FIG. 1) that is adapted to perform a development process on the photo-resist so as to form a desired photo-resist pattern. Since the contrast of the latent image of the photoacid formed in the photo-resist has been improved, the photolithographic pattern obtained after development can have reduced edge roughness.

Figure 2:
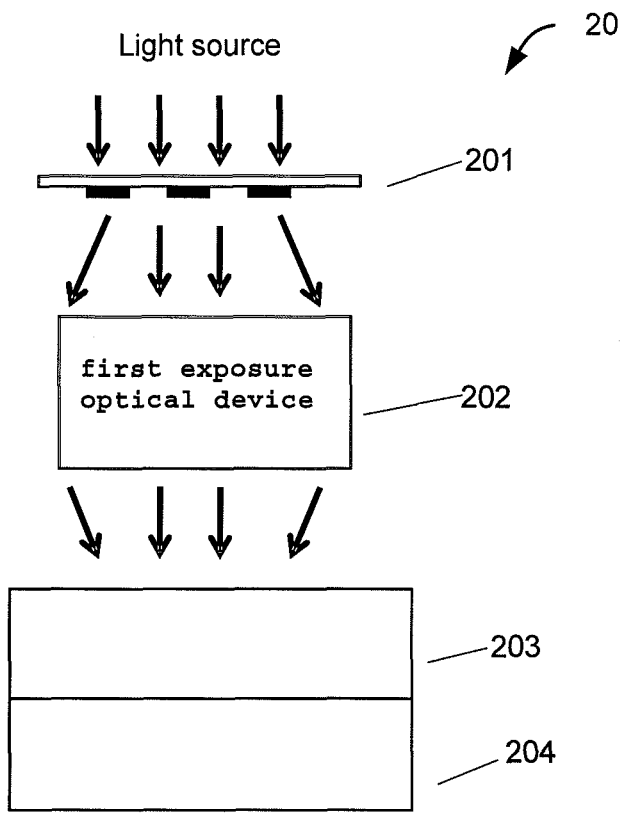
FIG. 2 is a simplified diagram illustrating the exposure of the photo-resist by a first exposure subsystem using a light of a first wavelength band according to an embodiment of the present invention.

FIG. 2 is a diagram illustrating the exposure of the photo-resist by a first exposure subsystem 20 using a light of a first wavelength band according to an embodiment of the present invention. As shown, when the light of the first wavelength band emitted from a light source passes through a mask 201, an optical pattern is projected onto the surface of the photo-resist 203 by means of a first exposure optical device 202, that is, a selected region of the surface of the photo-resist coated on a substrate 204 is selectively illuminated using the light of the first wavelength band.

One of ordinary skill in the art can appreciate that various exposure subsystems commonly used in the prior art can be used for realizing the purpose of selectively illuminating a selected region of the surface of the photo-resist coating the substrate using the light of the first wavelength band, and the present invention is not limited to the first exposure subsystem 20 as shown in FIG. 2.

The photoacid generator in the photo-resist absorbs the light of the first wavelength band to generate a photoacid in the photo-resist by photolysis. In this way, the optical pattern is converted into a latent image of the photoacid. One of ordinary skill in the art would appreciate that the mass concentration of the generated photoacid depends on parameters such as the exposure dose of the light of the first wavelength band and the mass concentration of the photoacid generator. One of ordinary skill in the art can reasonably chooses one or more of these parameters based on the teachings of the present invention.

In an ideal situation, the higher the contrast of the latent image of photoacid, the better, because, in this way, the photo-resist pattern formed after development will have a relatively small edge roughness. However, due to photoacid diffusion and photo diffraction of a mask, the contrast of the latent image will be degraded.

Figure 3:
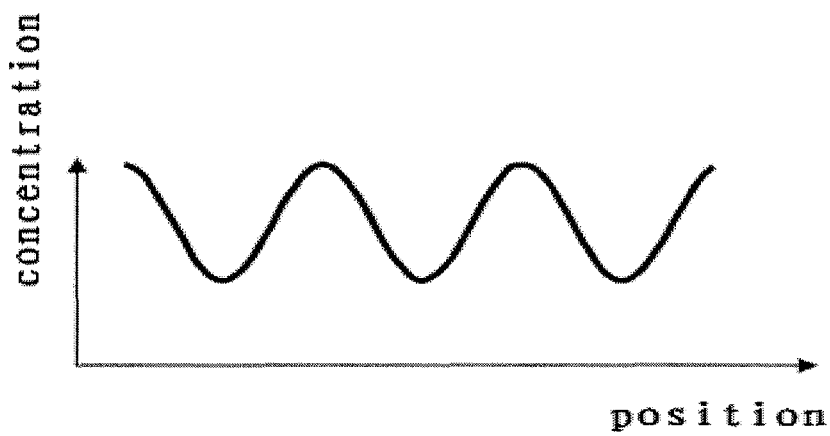
FIG. 3 shows a distribution curve of the mass concentration of the photoacid generated in the photo-resist according to an embodiment of the present invention.

FIG. 3 shows a distribution curve of the mass concentration of photoacid generated in the photo-resist. As shown in FIG. 3, the mass concentration of photoacid is larger than zero at any position of the photo-resist. Herein, one of ordinary skill in the art would appreciate that the mass concentration of the photoacid at any position refers to the mass of photoacid contained in a unit mass of photo-resist at this position.

Figure 4:
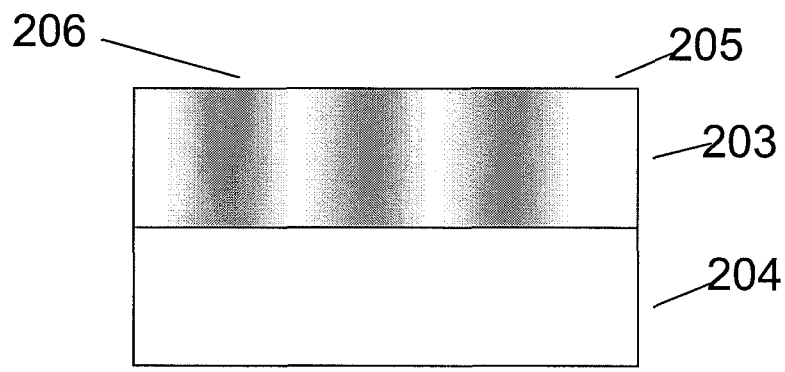
FIG. 4 is a diagram illustrating the mass concentration distribution of photoacid generated in the photo-resist according to an embodiment of the present invention.

FIG. 4 further illustrates the distribution of photoacid in the photo-resist according to an embodiment of the present invention. As shown in FIG. 4, a dark area 206 indicates positions where the mass concentration of the photoacid is low while a white area 205 indicates positions where the mass concentration of photoacid is high. Corresponding to the distribution curve of the mass concentration of photoacid of FIG. 3, as the photoacid mass concentration gradually decreases from a maximum value to a minimum value, the white area 205 gradually transits to the dark area 206 in the photo-resist 203. Due to the influence of diffusion of the photoacid and diffraction of the mask as mentioned above, the transitional region between the dark area 206 and the white area 205 is relatively indistinct, that is, the contrast of the latent image of photoacid is relatively low.

Figure 5A:
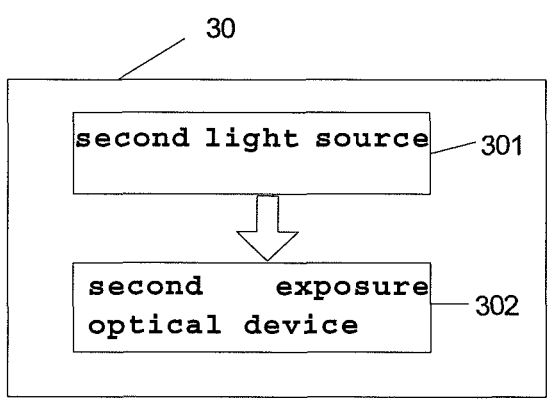
FIG. 5A is a simplified block diagram illustrating a second exposure subsystem according to an embodiment of the present invention.

FIG. 5A is a block diagram illustrating a second exposure subsystem 30 according to the embodiment of the present invention. As shown in FIG. 5A, the second exposure subsystem comprises a second light source 301 and a second exposure optical device 302.

Figure 5B:
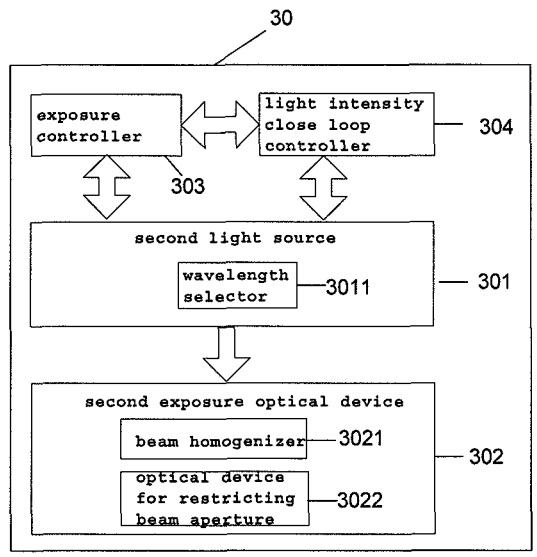
FIG. 5B is a simplified block diagram illustrating an example of the second exposure subsystem of FIG. 5A.

FIG. 5B is a block diagram illustrating an example of the second exposure subsystem 30 of FIG. 5A. The second light source 301 emits a light of a second wavelength band. The second light source can comprise a wavelength selector 3011, as shown in FIG. 5B, which selects the light of the second wavelength band among lights emitted from the second light source. The wavelength selector can be, for example, a selectable optical filter.

The second exposure optical device 302 projects the light of the second wavelength band onto all regions of the surface of the photo-resist.

Figure 6:
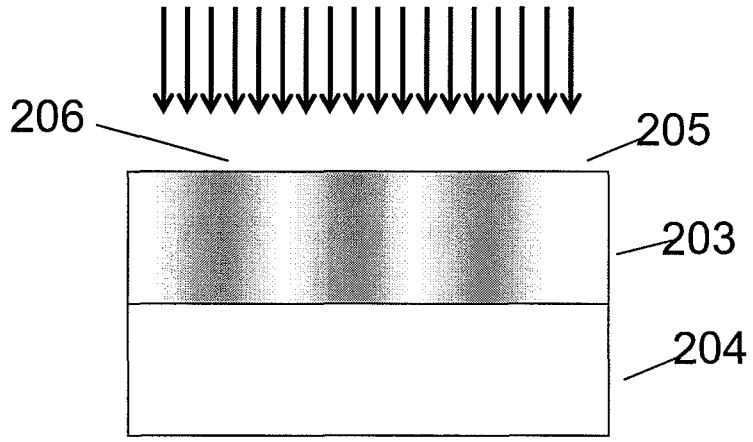
FIG. 6 is a diagram illustrating uniformly illuminating the photo-resist using a light of a second wavelength band according to an embodiment of the present invention.
Figure 7:
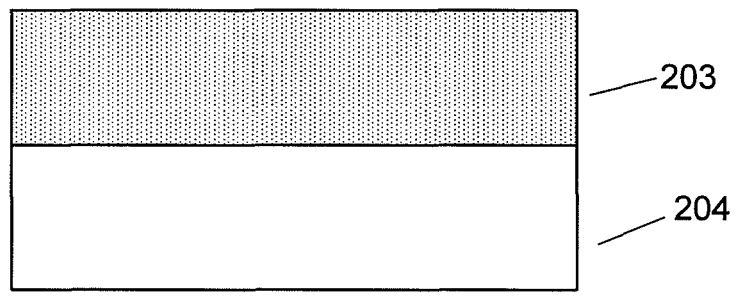
FIG. 7 is a diagram illustrating the mass concentration distribution of the photobase generated in the photo-resist according to an embodiment of the present invention.

FIG. 6 is a diagram illustrating uniformly illuminating the photo-resist using the light of the second wavelength band according to the embodiment of the present invention. As shown in FIG. 6, the light of the second wavelength band substantially uniformly illuminates the surface of the photo-resist. Since the photobase generator in the photo-resist 203 is sensitive to the light of the second wavelength band, photobase of uniform mass concentration will be generated in the photo-resist 203, as shown in FIG. 7.

Figure 8:
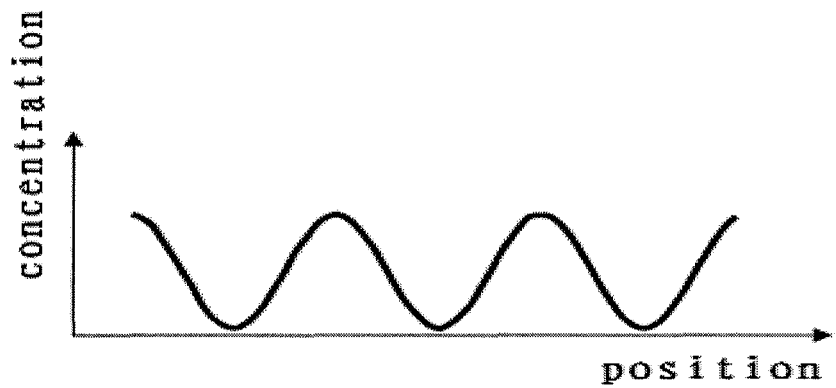
FIG. 8 shows a distribution curve of the mass concentration of the photoacid in the photo-resist, after a neutralization reaction between the photoacid and the photobase, according to an embodiment of the present invention.

One of ordinary skill in the art would appreciate that the mass concentration of a photobase can be controlled by controlling parameters such as the exposure dose of the light of the second wavelength band and the mass concentration of the photobase generator. For example, when the mass concentration of photobase is smaller than the minimum value of the mass concentration of photoacid, the photobase in the photo-resist will neutralize some photoacid so that the mass concentration of photoacid decreases throughout the photo-resist. As shown in FIG. 8, after the neutralization reaction, the minimum value of the mass concentration of photoacid is close to zero.

In an example embodiment, in order to control the exposure dose of the light of the second wavelength band, the second exposure subsystem 30 can further comprise an exposure controller 303 for setting a light intensity and an exposure time of the second exposure subsystem 30, as shown in FIG. 5B.

Since the actual light intensity of the light source may deviate from a predetermined light intensity, the second exposure subsystem can further comprise a light intensity closed loop controller 304 so as to effectively control the light intensity of the light source, as shown in FIG. 5B. The light intensity close loop controller 304 controls the light intensity of the light of the second wavelength band by determining whether or not a difference between the light intensity of the light of the second wavelength band and the set light intensity exceeds a predetermined threshold. The light intensity closed loop controller 304 can be coupled to the exposure controller 303 via a computer interface (not shown), for example.

In addition, in order to obtain a uniform illumination of the light of the second wavelength band emitted from the second light source 301, the second exposure optical device 302 can comprise a beam homogenizer 3021, as shown in FIG. 5B. The light of the second wavelength band emitted from the second light source 301 has a uniform intensity distribution after passing through the beam homogenizer 3021. The beam homogenizer 3021 can be, for example, a frosted glass.

As shown in FIG. 5B, the second exposure optical device 302 can further comprise an optical device 3022 for varying a diameter of a beam. The optical device 3022 for varying the diameter of the beam can include a lens or a slit in an exemplary embodiment.

Figure 9:
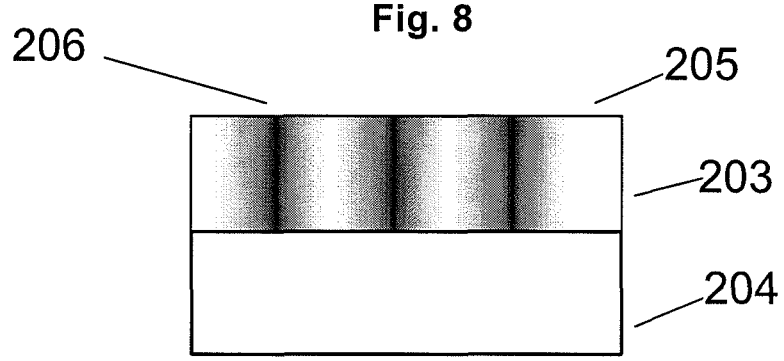
FIG. 9 is a diagram illustrating the mass concentration distribution of the photoacid in the photo-resist, after a neutralization reaction between the photoacid and the photobase, according to an embodiment of the present invention.

FIG. 9 further shows a latent image of the photoacid after the neutralization reaction. The dark area 206 becomes darker, which indicates that the photoacid in the dark area 206 has been substantially eliminated or reduced by the neutralization reaction. Thus, the contrast of the latent image of photoacid is enhanced.

Figure 10:
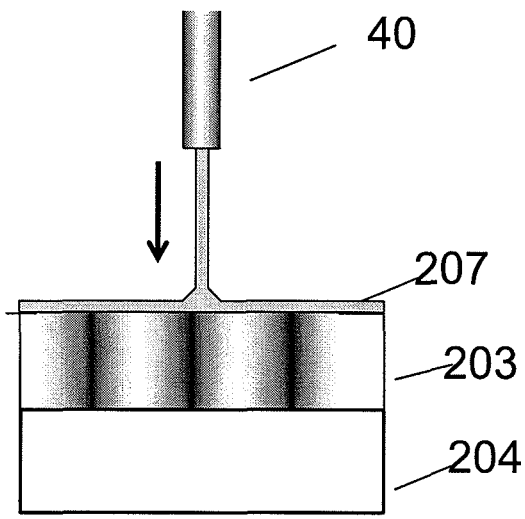
FIG. 10 is a diagram illustrating performing a development process on the photo-resist by a developing device 40 according to an embodiment of the present invention.
Figure 11:
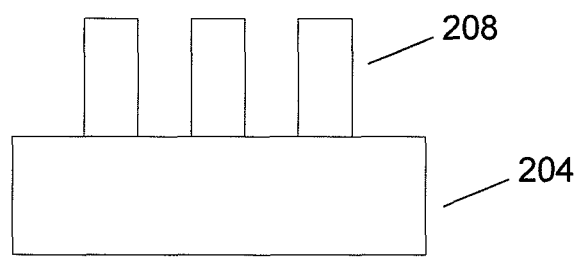
FIG. 11 is a diagram illustrating a photo-resist pattern obtained by a photolithographic apparatus according to an embodiment of the present invention.

FIG. 10 is a diagram illustrating a development process on the photo-resist that is performed by a developing device 40 according to an embodiment of the present invention. As shown in FIG. 10, the developing device 40 uses a developer 207 to perform the development process on the photo-resist 203. As for the positive photo-resist 203 shown in this example, the white area (a region where the photoacid is generated) is removed while the dark area (a region without photoacid) is remained, thereby forming a photo-resist pattern 208 as shown in FIG. 11. Of course, one of ordinary skill in the art should appreciate that, as for a negative photo-resist, a similar manner can be adopted to obtain a desired photo-resist pattern.

Figure 12:
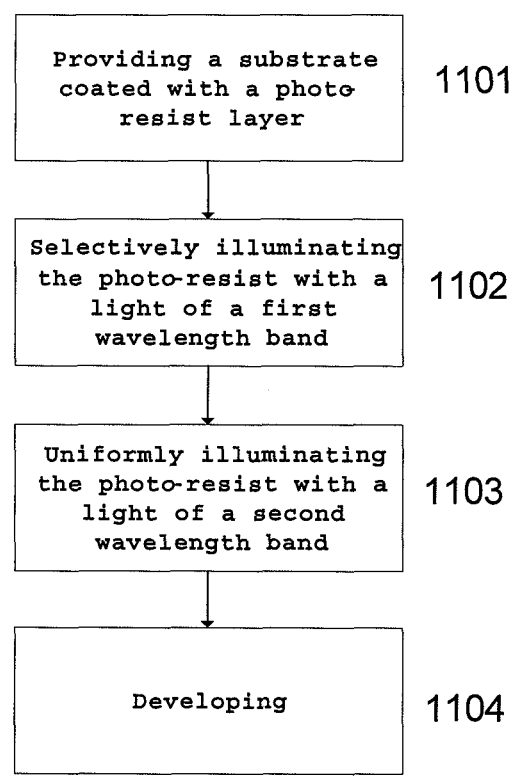
FIG. 12 is a flowchart illustrating the operation of a photolithographic apparatus according to an embodiment of the present invention.

FIG. 12 illustrates a flowchart of an operation of a photolithographic apparatus according to an embodiment of the present invention. As shown in FIG. 12, the operation of the photolithographic apparatus mainly includes the following steps: (1) Providing a substrate having its surface covered with the photo-resist (step 1101). In an example embodiment, a photo-resist 203 having a uniform thickness can be uniformly formed on the surface of the substrate 204; (2) Selectively illuminating a selected region of a surface of the photo-resist using a light of a first wavelength band (step 1102); (3) Uniformly illuminating all regions of the surface of the photo-resist using a light of a second wavelength band (step 1103); and (4) Performing a development process on the photo-resist to obtain a desired photo-resist pattern (step 1104).

In an embodiment, since the photoacid generator and the photobase generator are sensitive to different wavelength bands, it is possible to illuminate the photo-resist with the light of different wavelength bands during an exposure process by means of a photolithographic apparatus that contains a first exposure subsystem and a second exposure subsystem, so that the mass concentration of the photoacid and the mass concentration of the photobase in the photo-resist can be individually controlled and adjusted. Then, by means of the neutralization reaction between the photoacid and the photobase, the contrast of the latent image of the photoacid can be enhanced, and thus the edge roughness of the finally formed photo-resist pattern can be reduced. The photolithographic apparatus of the present invention not only overcomes the adverse influence on the contrast of the latent image of the photoacid that is caused by diffusion of the photoacid, but also overcomes the degradation of the contrast of the latent image of the photoacid due to diffraction of a mask.

Moreover, in the above embodiment, photoacid produces a chemical amplification action during the photolithographic process. One of ordinary skill in the art should appreciate that, photobase can also produce chemical amplification action during the photolithographic process.

According to another embodiment of the present invention, other photo-resists can be employed. These photo-resists may comprise a photoacid generator, a photobase generator, a matrix resin or the like. However, in these photo-resists, the photobase generator may be sensitive to light of a first wavelength band. When illuminated by the light of the first wavelength band, the photobase generator will absorb energy and generate a photobase by photolysis. The resin in the photo-resist will undergo, for example, a removal reaction, under the action with photobase to cause the resin in the exposed region to be removed.

One of ordinary skill in the art would appreciate that the mass concentration of the generated photobase depends on parameters such as the exposure dose of the light of the first wavelength band and the mass concentration of the photobase generator. In this way, the optical pattern can be converted to a latent image of the photobase.

Since the photoacid generator in the photo-resist is sensitive to the light of a second wavelength band, the photoacid generator will absorb energy and undergo photolysis when it is uniformly illuminated by the light of the second wavelength band, such that the photoacid of a uniform mass concentration is generated in the photoacid. Moreover, the first wavelength is different from the second wavelength band.

The mass concentration of photoacid can be controlled by controlling parameters such as the exposure dose of the light of the second wavelength band and the mass concentration of the photoacid generator. For example, when the mass concentration of photoacid is less than the minimum value of the mass concentration of the photobase, the photoacid in the photo-resist will neutralize a portion of the photobase, such that the mass concentration of the photobase decreases throughout the photo-resist. After the neutralization reaction, the minimum value of the mass concentration of the photobase is close to zero. Thus, the contrast of the latent image of photobase is improved.

Likewise, one of ordinary skill in the art would appreciate that, as for both the negative photo-resist and the positive photo-resist having similar properties, the photolithographic apparatus according to the present invention can be employed to obtain a desired photo-resist pattern.

One of ordinary skill in the art would appreciate that, as for the operation of the photolithographic apparatus shown in FIG. 12, the uniform illumination with the light of the second wavelength band can be performed immediately after the selective illumination with the light of the first wavelength band, with only an appropriately short interval there between. One of ordinary skill in the art can reasonably select such an interval so as to guarantee the high efficient working of the photolithographic apparatus based on the teachings of the present invention.

In this embodiment, a preferred solution is that the two operations are performed simultaneously, that is, the uniform illumination with the light of the second wavelength band is performed concurrently with the selective illumination with the light of the first wavelength band. This is favourable because the photolithographic processing can be performed at a high speed and the working efficiency of the photolithographic apparatus is improved.

Figure 13:
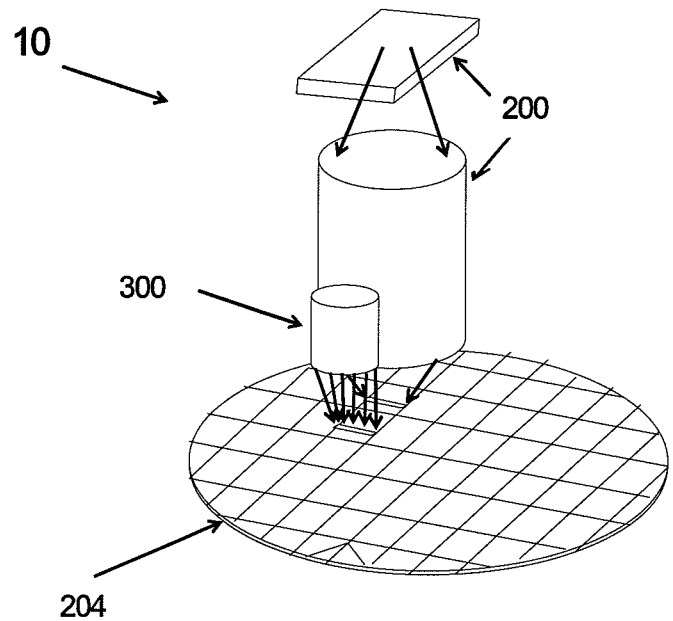
FIG. 13 is a diagram illustrating a photolithographic apparatus in which a second exposure subsystem is coupled to a first exposure subsystem according to an embodiment of the present invention.

FIG. 13 is a diagram illustrating a photolithographic apparatus 10 according to an embodiment of the present invention. As shown in FIG. 13, in the photolithographic apparatus 10, a second exposure subsystem 300 is coupled to a first exposure subsystem 200. The operation of the second exposure subsystem 300 is triggered by an operation of the first exposure subsystem 200, and is performed substantially at the same time with the operation of the first exposure subsystem 200.

The first exposure subsystem 200 can be similar to the first exposure subsystem 20 of FIG. 2. Moreover, one of ordinary skill in the art would appreciate that various conventional exposure subsystems can be employed without substantially modification to realize the purpose of selectively illuminating a selected region of the surface of the photo-resist coated on the substrate using the light of a first wavelength band, and the present invention is not limited to the first exposure subsystem illustrated in the embodiment.

In an example embodiment, in the case where the first exposure subsystem 200 is performing a scanning step exposure, the second exposure subsystem 300 will also perform a scanning step exposure at the same time, or following the operation of the first exposure subsystem 200. In the case where the first exposure 200 is performing a one-step exposure, the second exposure subsystem 300 will also perform a one-step exposure at the same time, or following the operation of the first exposure subsystem 200. In this way, it will ensure that the first and second exposure subsystems substantially operate in parallel, thereby achieving a high speed photolithographic processing and improving the efficiency of the photolithographic apparatus.

Considering that the substrate and the mask are generally required to be aligned with each other before the first exposure subsystem 200 performs the selective exposure, the photolithographic apparatus may further comprise an alignment and leveling device. The operation of the second exposure subsystem is triggered by the operation of the alignment and leveling device such that the operation of the second exposure subsystem is performed substantially at the same time with the operation of the alignment and leveling device, which can increase the productivity of the photolithographic apparatus.

Figure 14:
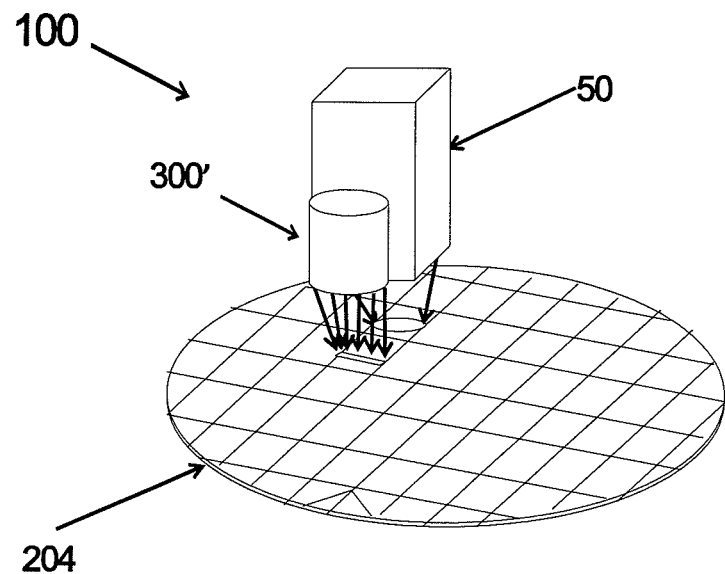
FIG. 14 is a diagram illustrating a photolithographic apparatus in which a second exposure subsystem is coupled to an alignment and leveling device, according to an embodiment of the present invention.

FIG. 14 is a diagram illustrating a photolithographic apparatus 100 according to a further embodiment of the present invention. As shown in FIG. 14, the photolithographic apparatus 100 further comprises an alignment and leveling device 50 in addition to a second exposure subsystem 300'. The second exposure subsystem 300' is coupled to the alignment and leveling device 50 such that the uniform exposure of the second exposure subsystem 300' can be performed at the same time, or immediately after an alignment of the alignment and leveling device. In this situation, the uniform illumination with the light of a second wavelength band can be performed before the selective illumination with the light of a first wavelength band, and one of ordinary skill in the art can appreciate that the present invention can be implemented in this manner.

Although some specific embodiments of the present invention have been demonstrated in detail with exemplary embodiments, one of ordinary skill in the art would recognize other variations, modifications and alternatives. The scope of the present invention should, therefore, be determined by the appended claims.

What is claimed is:

1. A photolithographic apparatus comprising:
a first exposure subsystem for selectively illuminating a selected region of a surface of a photo-resist coating a substrate using a light of a first wavelength band, said photo-resist comprising a first component that generates a first chemical substance in response to said first wavelength band of light and produces a chemical amplification action; and
a second exposure subsystem for substantially uniformly illuminating all regions of the surface of the photo-resist using a light of a second wavelength band, said photo-resist further comprising a second component that generates a second chemical substance in response to said second wavelength band of light, wherein said second wavelength band is different from said first wavelength band, said second chemical substance reacting with said first chemical substance to reduce a mass concentration of said first chemical substance in the photo-resist.

2. The photolithographic apparatus of claim 1 wherein said first exposure subsystem comprises:
a first light source for emitting the light of the first wavelength band; and a first exposure optical device for forming an optical pattern on the surface of the photo-resist when the light of the first wavelength band is projected through a mask disposed between the first light source and the substrate, said optical pattern defining the selected region of the surface of the photo-resist.

3. The photolithographic apparatus of claim 1 wherein said second exposure subsystem comprises:
a second light source for emitting the light of the second wavelength band; and
a second exposure optical device for projecting the light of the second wavelength band onto all the regions of the surface of the photo-resist.

4. The photolithographic apparatus of claim 3 wherein said second exposure optical device comprises:
a beam homogenizer adapted to uniformly distribute the intensity of the light of the second wavelength band; and
an optical device for varying a diameter of the beam passing through the beam homogenizer.

5. The photolithographic apparatus of claim 3 wherein said second light source comprises a wavelength selector for selecting the light of the second wavelength band among lights emitted from the second light source.

6. The photolithographic apparatus of claim 3 wherein said second exposure subsystem further comprises an exposure controller for controlling a light intensity and an exposure time of said second exposure subsystem.

7. The photolithographic apparatus of claim 6, wherein said second exposure subsystem further comprises a light intensity closed loop controller coupled to said exposure controller for controlling a light intensity of the light of the second wavelength band by determining whether a difference between the light intensity of the light of the second wavelength band and a predetermined light intensity exceeds a predetermined threshold.

8. The photolithographic apparatus of claim 1, wherein said second exposure subsystem is coupled to the first exposure subsystem and is triggered by said first exposure subsystem.

9. The photolithographic apparatus of claim 8 wherein the uniform illumination by the second exposure subsystem using the light of the second wavelength band is performed concurrently with the selective illumination by the first exposure subsystem.

10. The photolithographic apparatus of claim 8 wherein the uniform illumination by the second exposure subsystem using the light of the second wavelength band is performed after the selective illumination by the first exposure subsystem.

11. The photolithographic apparatus of claim 1 further comprising an alignment and leveling device for aligning and leveling said substrate with said mask.

12. The photolithographic apparatus of claim 11 wherein said second exposure subsystem is coupled to the alignment and leveling device, an operation of said second exposure subsystem is triggered by an operation of said alignment and leveling device.

13. The photolithographic apparatus of claim 12 wherein the uniform illumination by said second exposure subsystem using the light of the second wavelength band is performed before the selective illumination by the first exposure subsystem.

14. The photolithographic apparatus of claim 12 wherein the uniform illumination by said second exposure subsystem using the light of the second wavelength band is performed concurrently with the alignment and leveling by said alignment and leveling device.

15. The photolithographic apparatus of claim 12 wherein the uniform illumination by said second exposure subsystem using the light of the second wavelength band is performed after the alignment and leveling by said alignment and leveling device.

16. The photolithographic apparatus of claim 1 wherein said photo-resist further comprises a matrix resin, and wherein said first chemical substance is adapted to react with said matrix resin to form a latent image.

17. The photolithographic apparatus of claim 1 wherein said first component is a photoacid generator and said first chemical substance is a photoacid.

18. The photolithographic apparatus of claim 17 wherein said second component is a photobase generator and said second chemical substance is a photobase.

19. The photolithographic apparatus of claim 1 wherein said first component is a photobase generator and said first chemical substance is a photobase.

20. The photolithographic apparatus of claim 19 wherein said second component is a photoacid generator and said second chemical substance is a photoacid.

21. The photolithographic apparatus of claim 1 further comprising a developing device for performing a development process on said photo-resist to form a desired photo-resist pattern.

22. A photolithographic apparatus for use with a photo-resist comprising first and second components and coating a substrate, wherein said first component of the photo-resist is adapted to generate a first chemical substance when a light of a first wavelength band illuminates a selected region of a surface of the photo-resist and produces a chemical amplification action, said photolithographic apparatus comprising:
a light source for emitting a light of a second wavelength band; and
an exposure optical device for substantially uniformly illuminating all regions of the surface of the photo-resist using the light of the second wavelength band, said second component generating a second chemical substance in response to said light of the second wavelength band, wherein said second wavelength band is different from said first wavelength band, said second chemical substance reacting with said first chemical substance to reduce a mass concentration of said first chemical substance in the photo-resist.

23. The photolithographic apparatus of claim 22, wherein said exposure optical device comprises:
a beam homogenizer adapted to uniformly distribute the intensity of the light of the second wavelength band; and
an optical device for varying a diameter of the beam passing through the beam homogenizer.

24. The photolithographic apparatus of claim 22, wherein said light source comprises a wavelength selector for selecting the light of the second wavelength band among lights emitted from the light source.

25. The photolithographic apparatus of claim 22 further comprising an exposure controller for controlling a light intensity and an exposure time of said photolithographic apparatus.

26. The photolithographic apparatus of claim 25 further comprising a light intensity closed loop controller coupled to said exposure controller for controlling a light intensity of the light of the second wavelength band by determining whether a difference between the light intensity of the light of the second wavelength band and a predetermined light intensity exceeds a predetermined threshold.

27. The photolithographic apparatus of claim 22 wherein the uniform illumination with the light of the second wavelength band is performed concurrently with the selective illumination with the light of the first wavelength band.

28. The photolithographic apparatus of claim 22 wherein the uniform illumination with the light of the second wavelength band is performed after the selective illumination with the light of the first wavelength band.

29. The photolithographic apparatus of claim 22 wherein the uniform illumination with the light of the second wavelength band is performed before the selective illumination with the light of the first wavelength band.

30. The photolithographic apparatus of claim 22 further comprising an alignment and leveling device for aligning and leveling said substrate with said mask wherein the uniform illumination with the light of the second wavelength band is performed concurrently with the alignment by the alignment and leveling device.

31. The photolithographic apparatus of claim 22 further comprising an alignment and leveling device wherein the uniform illumination with the light of the second wavelength band is performed after the alignment by the alignment and leveling device.

32. The photolithographic apparatus of claim 22, wherein said photo-resist further comprises a matrix resin, and wherein said first chemical substance is adapted to react with said matrix resin to form a latent image.

33. The photolithographic apparatus of claim 22 wherein said first component is a photoacid generator and said first chemical substance is a photoacid.

34. The photolithographic apparatus of claim 33 wherein said second component is a photobase generator and said second chemical substance is a photobase.

35. The photolithographic apparatus of claim 22 wherein said first component is a photobase generator and said first chemical substance is a photobase.

36. The photolithographic apparatus of claim 35 wherein said second component is a photoacid generator and said second chemical substance is a photoacid.

37. The photolithographic apparatus of claim 22 further comprising a developing device for performing a development process on said photo-resist so as to form a desired photo-resist pattern.

38. A photolithographic method comprising the steps of:
selectively illuminating a selected region of a surface of a photo-resist coating a substrate using a light of a first wavelength band, said photo-resist comprising a first component that generates a first chemical substance in response to said first wavelength band of light and produces a chemical amplification action; and
substantially uniformly illuminating all regions of the surface of the photo-resist using a light of a second wavelength band, said photo-resist further comprising a second component that generates a second chemical substance in response to said second wavelength band of light, wherein said second wavelength band is different from said first wavelength band, said second chemical substance reacting with said first chemical substance to reduce a mass concentration of said first chemical substance in the photo-resist.

* * * * *